(12) United States Patent
Leek et al.

(10) Patent No.: US 10,925,154 B2
(45) Date of Patent: Feb. 16, 2021

(54) TAMPER DETECTION

(71) Applicant: Texas Instruments Incorporated, Dallas, TX (US)

(72) Inventors: Alan Henry Leek, Frisco, TX (US); Jace Hunter Hall, Farmers Branch, TX (US)

(73) Assignee: Texas Instruments Incorporated, Dallas, TX (US)

( * ) Notice: Subject to any disclaimer, the term of this patent is extended or adjusted under 35 U.S.C. 154(b) by 80 days.

(21) Appl. No.: 16/263,261

(22) Filed: Jan. 31, 2019

(65) Prior Publication Data

US 2020/0253042 A1  Aug. 6, 2020

(51) Int. Cl.
*H05K 1/02* (2006.01)
*G01D 5/24* (2006.01)
*G01R 27/26* (2006.01)

(52) U.S. Cl.
CPC ............ *H05K 1/0275* (2013.01); *G01D 5/24* (2013.01); *G01R 27/2605* (2013.01); *H05K 1/023* (2013.01)

(58) Field of Classification Search
CPC ........ H05K 1/0275; H05K 1/023; G01D 5/24; G01R 27/2605; G06F 3/0418;
(Continued)

(56) References Cited

U.S. PATENT DOCUMENTS 6,628,124 B1 * 9/2003 Yamagata ............ G01D 5/2417
324/633

7,784,366 B2 * 8/2010 Daverman .............. G01L 1/142
73/780

(Continued)

FOREIGN PATENT DOCUMENTS

GB  2174830 A  11/1986
GB  2256956    12/1992
(Continued)

OTHER PUBLICATIONS

International Search Report for PCT/US2020/015569 dated May 28, 2020.

*Primary Examiner* — Vinh P Nguyen
(74) *Attorney, Agent, or Firm* — Brian D. Graham; Charles A. Brill; Frank D. Cimino

(57) ABSTRACT

In described examples, an enclosure for circuitry includes a platform, a charge source, a first capacitive plate, a second capacitive plate, and a capacitive sensor. The circuitry is fixedly coupled to the platform. The first capacitive plate is also fixedly coupled to the platform, and either alone, or together with the platform, surrounds a volume containing the circuitry and the charge source, the charge source electrically coupled to and configured to charge the first capacitive plate. The second capacitive plate is fixedly coupled to the platform without touching the first capacitive plate, and either alone, or together with the platform, surrounds the first capacitive plate. The second capacitive plate is configured so that there is an electric potential difference between the first capacitive plate and the second capacitive plate. The capacitive sensor is electrically connected to the first capacitive plate and configured to determine when a capacitance between the first and second capacitive plates is changed.

23 Claims, 5 Drawing Sheets

(58) Field of Classification Search
CPC .................. G06F 3/044; G06F 3/0414; G06F 2203/04103; G06F 2203/04106; H03K 17/962; H03K 17/98; H03K 2217/9401; H03K 2217/960765
See application file for complete search history.

(56) References Cited

U.S. PATENT DOCUMENTS

| | | | | |
|---|---|---|---|---|
| 8,736,283 | B2 * | 5/2014 | Dorrough | G01R 27/26 |
| | | | | 324/663 |
| 9,990,087 | B2 * | 6/2018 | Richards | G06F 3/0418 |
| 10,107,014 | B2 * | 10/2018 | Sanchez | E05B 45/061 |
| 10,663,613 | B2 * | 5/2020 | Dorrough | G01V 3/081 |
| 2017/0332485 | A1 * | 11/2017 | Busby | H05K 1/0275 |

FOREIGN PATENT DOCUMENTS

| | | |
|---|---|---|
| WO | 1999/21142 | 4/1999 |
| WO | 2012/155057 | 11/2012 |

\* cited by examiner

US 10,925,154 B2

TAMPER DETECTION

BACKGROUND

This application relates generally to tamper-proofing of electronic systems, and more particularly to tamper-proof housings for sensitive electronic circuitry at the printed circuit board (PCB) level.

Many forms of electronic security are made vulnerable to penetration if an adverse party has physical access to the system. Reverse engineering, decapsulation, hardware-based man-in-the-middle attacks, and other methods can enable an attacker with physical access to system busses and connected integrated circuits (ICs) to circumvent system-level and/or device-level security. Physical attack tampering typically takes place in order for certain intellectual property (IP) assets to be uncovered, stolen, altered, manipulated, destroyed, or otherwise compromised. Such IP assets can include software and its related data, including as examples financial information, authentication keys, or firmware images; or hardware, such as sensitive chip-level or PCB designs, or other physical systems such as clock sources, digital sequence sources, or actuator control. Prior art tamper-proof system coverings include, for example, potting, electro-mechanical switches configured to break contact on tampering, PCB tamper mesh enclosures, or a switch or button using inductive sensing coils, Hall effect detection, or ambient light detection.

SUMMARY

In described examples, an enclosure for circuitry includes a platform, a charge source, a first capacitive plate, a second capacitive plate, and a capacitive sensor. The circuitry is fixedly coupled to the platform. The first capacitive plate is also fixedly coupled to the platform, and either alone, or together with the platform, surrounds a volume containing the circuitry and the charge source, the charge source electrically coupled to and configured to charge the first capacitive plate. The second capacitive plate is fixedly coupled to the platform without touching the first capacitive plate, and either alone, or together with the platform, surrounds the first capacitive plate. The second capacitive plate is configured so that there is an electric potential difference between the first capacitive plate and the second capacitive plate. The capacitive sensor is electrically connected to the first capacitive plate and configured to determine when a capacitance between the first and second capacitive plates is changed.

DETAILED DESCRIPTION

Figure 1:
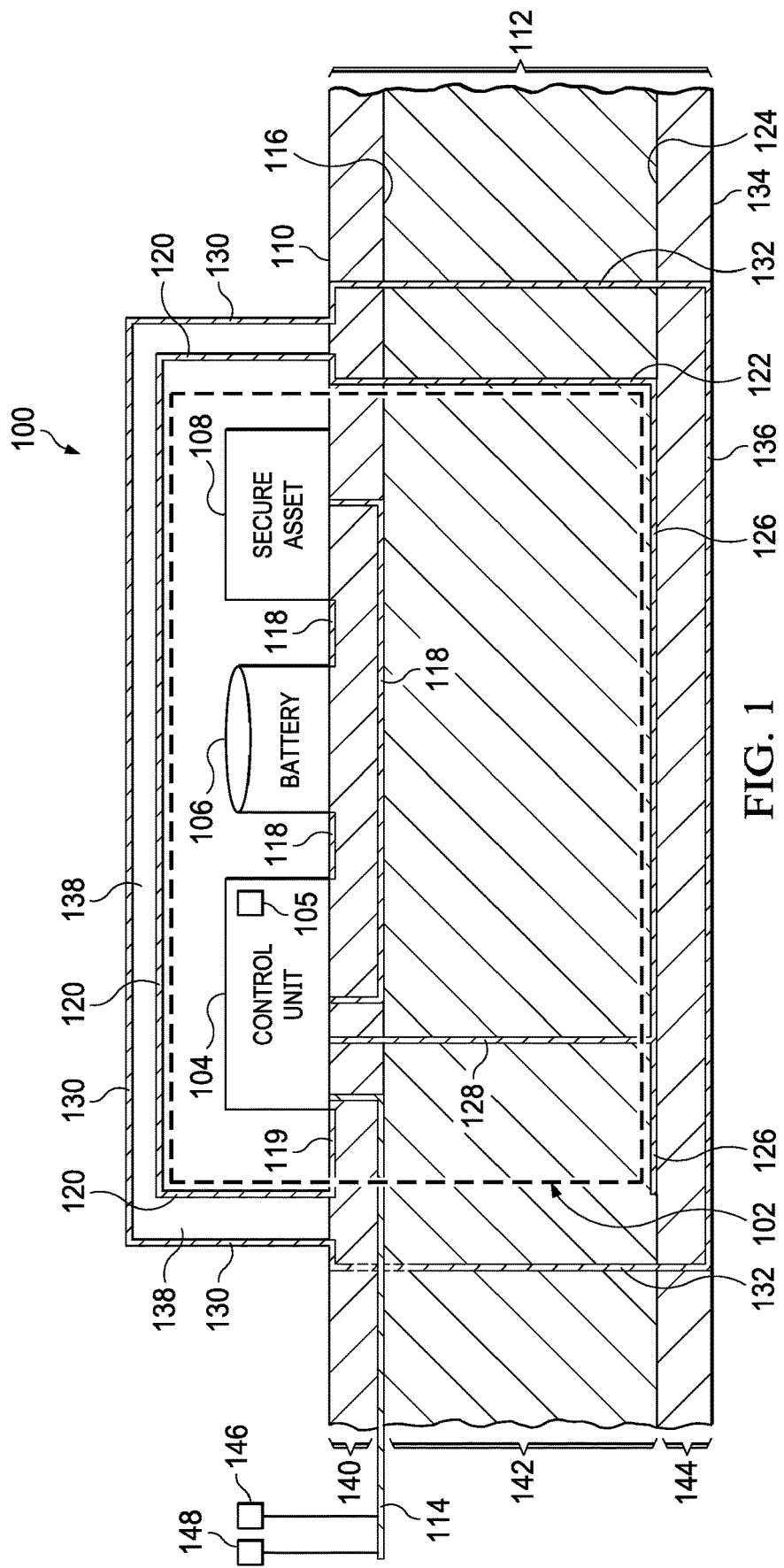
FIG. 1 shows an example of a side view of an electrical block diagram view of a system 100 including a secure enclosure for tamper detection using capacitive sensing.

FIG. 1 shows an example of a side view of an electrical block diagram view of a system 100 including a secure enclosure 102 for tamper detection using capacitive sensing, where by way of introduction secure enclosure 102 includes a conductive structural inner volume (120, 122, 126, 128) and a conductive structural outer volume (130, 132, 136). The conductive structural outer volume surrounds the conductive structural inner volume, thereby presenting capacitance between the inner and outer volumes. As shown in FIG. 1, a control unit 104, a battery 106, and a secure asset 108 (such as one or more ICs) are mounted on a top surface 110 of a top layer 140 of a multi-layer PCB 112 (such as an FR4 PCB). The control unit 104 includes a capacitive sensor 105 and logic for determining whether tampering has occurred based on capacitance measurements of the sensor. ("Capacitive sensor" refers to a sensor which senses capacitance. Changes in capacitance are preferably measured as relative changes in capacitance. In some embodiments, changes in capacitance can be measured as absolute changes in capacitance.) Changes in capacitance between the conductive structural inner volume and the conductive structural outer volume (e.g., changes greater than a threshold) indicate tampering.

The PCB 112 has a top layer 140, a middle layer 142, and a bottom layer, 144. The top layer 140 has a top surface 110. The middle layer 142 has a middle-top surface 116 at an interface between the top layer 140 and the middle layer 142, and a middle-bottom surface 124 at an interface between the middle layer 142 and the bottom layer 144. The bottom layer has a bottom surface 134.

The "inside" of the secure enclosure 102 refers herein to the interior of the above-introduced inner volume, which is between (enclosed by) an inner top shield 120, such as a hollow rectangular parallelepiped open along one larger face and mounted on the top surface 110, and an inner bottom shield 126, such as a conductive plate located on the middle-bottom surface 124 (between the middle layer 142 and bottom layer 144 of the PCB 112). The "outside" of the secure enclosure 102 refers herein to a volume external to the above-introduced outer volume, which is beyond an outer top shield 130, such as a hollow rectangular parallelepiped open along one larger face but larger than inner top shield 120 and mounted on the top surface 110, and an outer bottom shield 136, such as a conductive plate mounted on the bottom surface 134. The inner top shield 120, inner bottom shield 126, outer top shield 130, and outer bottom shield 136 are further described below. There is preferably a single electrical connection 114 connecting circuitry inside the secure enclosure to circuitry outside the secure enclosure 102, to avoid providing routes—physical openings in the conductive structural volumes—by which an attacker might attempt to gain physical access to the inside of the secure enclosure. The connection 114 preferably runs along the middle-top surface 116, thereby embedding a length of the connection 114 within the PCB 112 to make tampering with the connection 114 more difficult, and connects to the control unit 104.

In some embodiments, electrical activity within the secure enclosure 102, or between the inside and outside of the secure enclosure 102, can affect sensed capacitance. This can be mitigated by, for example, PCB design, such as routing (direction and size of connections); bandwidth (or associated data rate) of signals; and timing and/or forced synchronicity capacitance measurements (for example, the system could force local electrical activity to stop when capacitance measurements are taken).

Figure 2:
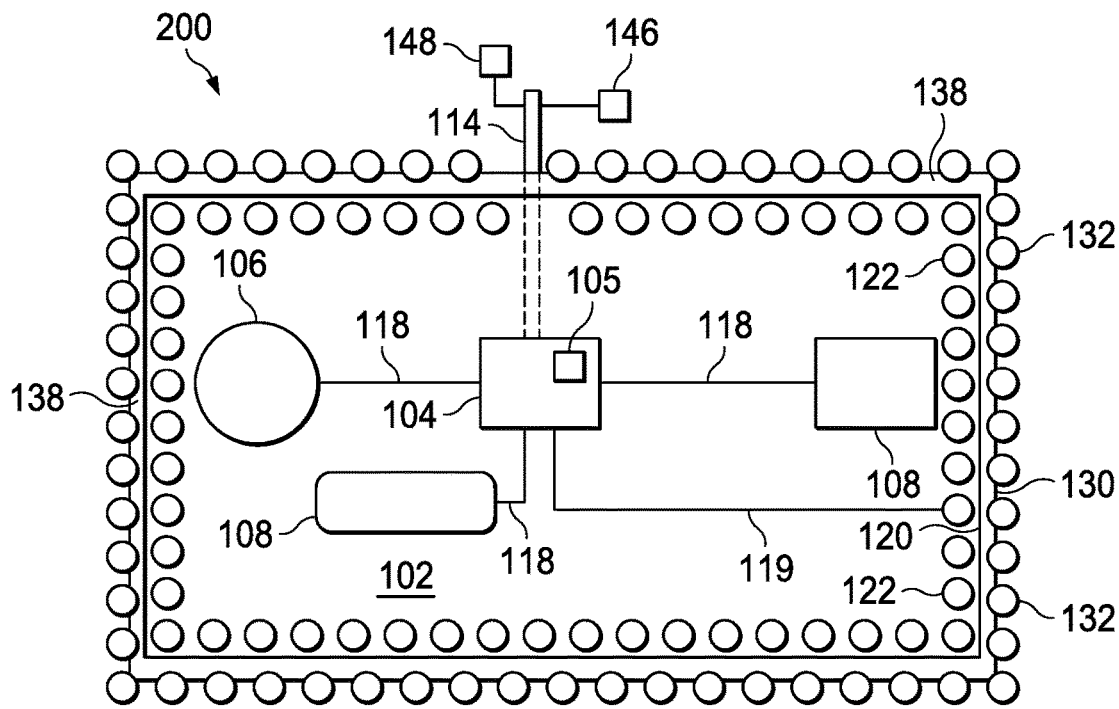
FIG. 2 shows an example plan and schematic view of the system of FIG. 1.

The control unit 104 is preferably connected by electrical lines 118 to the battery 106 and the secure asset 108 to mediate input and output (I/O) between the secure asset 106 and the outside of the secure enclosure 102, preventing I/O if tampering is detected. The control unit 104 is electrically connected through an electrical connection 119 to the inner top shield 120. The inner top shield 120 surrounds the inside of the secure enclosure 102 without gaps in the inner top shield 120 or between the inner top shield 120 and the PCB 112. The inner top shield 120 is made of material appropriate as a capacitive plate (e.g., conductor), preferably selected to act as electromagnetic (EM) shielding, both with respect to photons (that is, the capacitive material is opaque), and with respect to electric and magnetic fields. The inner top shield 120 is mounted on the top surface 110 of the PCB 112 and is electrically connected to the control unit 104 and the battery 106, and to one or more capacitive sense vias 122. Capacitive sense vias are conductive, and electrically couple the control unit 104 (and its integrated capacitive sensor 105) to the top and bottom inner shields 120, 130. One such via 122 is shown in FIG. 1, but as shown in FIG. 2, multiple adjacent capacitive sense vias 122 are preferably implemented.

In the example shown in FIG. 1, the battery 106 is connected to the inner top shield 120 via the control unit 104 (using the electrical connection 119), so that the control unit 104 can regulate the charge on the inner top shield 120 and the inner bottom shield 126. That is, the battery 106 is connected to power the control unit 104, and the control unit 104 applies charge to the inner top shield 120, the capacitive sense vias 122, and the inner bottom shield 130.

The capacitive sense vias 122 interpenetrate the PCB 112 from the top surface 110 to the middle-bottom surface 124. The capacitive sense vias 122 are electrically connected to the inner bottom shield 126. The inner bottom shield 126 is mounted on the bottom surface 124 of the PCB 112, covers an area of the middle-bottom surface 124 matching and aligned (e.g., vertically) with an area of the top surface 110 covered by the inner top shield 120, and is made of a conductive material selected to act as a capacitive plate and as EM shielding. A return line 128 electrically connects the inner bottom shield 126 to a channel of the control unit 104. As further described below, e.g., with respect to FIG. 2, there are preferably multiple capacitive sense vias 122, located within a perimeter of the top and bottom inner shields 120, 130 (viewing the system 100 looking towards and perpendicularly to the top surface 110, as in FIG. 2). The preferred arrangement of the vias 122, 132 can also be described as staggered placement of the capacitive sense vias 122 and ground vias 132, or analogized to an alternating crenellation (with ground vias 132 in the upper portions of crenellation notches, and capacitive sense vias 122 in lower portions of crenellation notches, or vice versa). From the preceding, therefore, one skilled in the art should now appreciate, as introduced earlier, that the inner top shield 120, capacitive sense vias 122, and inner bottom shield 126 (together referred to herein as the inner shield) together surround and enclose the secure enclosure 102.

The outer top shield 130 is mounted on the PCB 112 so that the outer top shield 130 surrounds and is near to, but not in electrical contact with, the inner top shield 120. That is, the inner top shield 120 is nested within the outer top shield 130. There are preferably no gaps in the outer top shield 130, or between the outer top shield 130 and the PCB 112, to prevent exterior access to the inside of the secure enclosure 102. The outer top shield 130, like the inner top shield 120, is made of a conductive material, preferably selected to act as a capacitive plate and as EM shielding. The inner and outer top shields 120, 130 can be mounted on the PCB using, for example, solder or mounting brackets which create a reliable electrical connection between the shields and power or ground (respectively).

The outer top shield 130 is connected to multiple ground vias 132, which are connected to a ground (not shown) located outside of the secure enclosure 102. The ground vias 132 interpenetrate the PCB 112 from the top surface 110 to the bottom surface 134. The ground vias 132 are electrically connected to the outer bottom shield 136. The outer bottom shield 136 is mounted on the bottom surface 134 of the PCB, covers an area of the bottom surface 134 matching and aligned (e.g., vertically) with an area of the top surface 110 covered by the outer top shield 130, and is made of a material selected to act as a capacitive plate and as EM shielding. The ground vias 132 are preferably disposed in a ring (i.e., surrounding alignment, but not necessarily circular) near the perimeter of the outer bottom shield 136. The capacitive sense vias 122 and the ground vias 132 are preferably "blind" vias, that is, they are preferably not externally visible or physically accessible when the secure enclosure 102 is fully assembled (for example, a portion of the capacitive sense vias 122 connected to the middle-bottom surface 124 is covered by the inner bottom shield 126, and a portion of the ground vias 132 connected to the bottom surface 134 is covered by the outer bottom shield 136). The outer top shield 130, the ground vias 132, and the outer bottom shield 136 together surround and enclose the secure enclosure 102, the inner top shield 120, the capacitive sense vias 122, and the inner bottom shield 130.

Preferably, secure asset 108 devices are placed only on a side of the PCB 112 enclosed by the inner and outer top shields 120, 130. (In some embodiments, volumes which can fit secure assets 108 can be located on more than one side of the PCB 112, such as on both sides of a planar PCB 112.) Also, preferably, sensitive power planes and signal traces reside within the secure enclosure 102.

The inner top shield 120 and the outer top shield 130 act as a top plate capacitor, driven by the control unit 104 (powered by the battery 106) using the capacitive sense vias 122, and grounded by the ground vias 132. Similarly, the inner bottom shield 126 and the outer bottom shield 136 act as a bottom plate capacitor, driven by the battery 106 using the capacitive sense vias 122, and grounded by the ground vias 132. EM field lines run between the inner top shield 120 and the outer top shield 130, and between the inner bottom shield 126 and the outer bottom shield 136. The control unit 104 preferably controls the inner top shield 120, capacitive sense vias 122, and inner bottom shield 130 to charge and (partially) discharge at a high frequency, for example, 1 MHz.

The control unit 114 is configured to measure changes in capacitance of the top and bottom plate capacitors. An empty volume 138 between the inner and outer top shields 120, 130 or inner and outer bottom shields 126, 136 (PCB material, rather than an empty volume, is located between the bottom shields 126, 136 in the example shown in FIG. 1) can be filled using a dielectric material comprising air or another dielectric material, such as a dielectric material with increased capacitance and/or reduced production handling requirements and/or cost.

FIG. 2 shows an example plan and schematic view 200 of the system 100 of FIG. 1. From the above description and the plan view of FIG. 2, one skilled in the art will further appreciate that the outer perimeter of inner top shield 120 encloses each of the control unit 104, the battery 106, and the secure asset 108. Further, the plural capacitive sense vias 122 form a generally inner perimeter which, from FIG. 1, is understood as into the page from the perspective of FIG. 2, and that is located within the outer boundary (perimeter) of inner top shield 120 and within the outer boundary (perimeter) of outer top shield 130. Similarly, the plural ground vias 132 form a generally outer perimeter which, also from FIG. 1, is understood as into the page from the perspective of FIG. 2, and that is located outside the outer boundary (perimeter) of outer top shield 130 and/or overlapping the outer boundary (perimeter) of outer top shield 130.

In operation and as further detailed below with respect to FIG. 4, the control unit 104 can detect changes in capacitance as between shields 120, 126, 130, 136, for instance were such a change to occur based on an attempt to tamper with the system 100. Changes in capacitance measured by the control unit 104 can occur as a result of, for example, one of the shields 120, 126, 130, 136 being moved, removed, distorted, or deflected (changing distances between plates), drilled through or ablated (changing the size, and therefore total conductor area, of a plate; and/or shorting the inner and outer plates if a drill bit is conductive), or charged by an exterior source (changing the charge on a plate). Changes in capacitance measured by the control unit 104 can also occur as a result of, for example, a drill bit (or other device for removing material) being used to access the inside of the secure enclosure 102 and drilling through or contacting a ground via 132 or a capacitive sense via 122 on the way; or an electrically conductive probe contacting one (or more) of the shields 120, 126, 130, 136 or the vias 122, 132.

As shown in FIG. 2, the capacitive sense vias 122 and the ground vias 132 are preferably arranged in closely spaced concentric geometries around a perimeter of the secure enclosure 102, with inner ring vias (capacitive sense vias 122) having alternating positions (staggered) with outer ring vias (ground vias 132), for example to prevent the PCB 112 from being drilled through by an attacker seeking access to the secure enclosure. (A break in the via rings, through which the connection 114 passes, is shown for clarity and simplicity. In preferred embodiments, the connection 114 is routed between the capacitive sense vias 122 and the ground vias 132 without a break in the via rings.) Also, the perimeter of the capacitive sense vias 122 is preferably within the perimeter of the top and bottom inner shields 120, 130, and the perimeter of the ground vias 132 is preferably within or overlaps the perimeter of the top and bottom outer shields 126, 136. Together, the shields 120, 126, 130, 136 and the vias 122, 132 thus provide a physical barrier against attacks attempting to physically access the secure enclosure, while allowing sufficient spacing to be arranged in or on the surface of the PCB 112 to pass power and/or signaling traces from the outside to the inside of the secure enclosure 102.

The outer shield is electrically connected and surrounds the secure enclosure 102 in three dimensions, forming a Faraday cage around the secure enclosure 102. That is, the outer shield will generally block EM fields originating outside the secure enclosure 102 from penetrating to affect the inside of the secure enclosure 102 (isolating the secure enclosure 102 from external galvanic and photonic signals). This means that the outer shield being connected to the system ground shields the secure enclosure 102 from EM-based attacks (such as electrical overvoltage stress), and from unintended EM interference (reducing noise within the secure enclosure 102). This also makes the control unit 104 less sensitive to false tamper detection events, such as during system assembly or other intended end-user handling, because the outer shield being connected to system ground means that in ordinary handling, changes in capacitance in the top and bottom plate capacitors will generally be caused only by removal of the top or outer bottom shield 126, 136.

In some embodiments, when the control unit 104 detects tampering (a change in capacitance in the top and/or bottom plate capacitors), it can cause the secure asset 108 to be disabled. For example, the secure asset 108 can be caused to delete sensitive data, make sensitive data unchangeable, or trigger a physically self-destructive event (for example, burning an entire array of programmable fuses to make data previously stored in a select portion of the fuses unreadable).

Figure 3A:
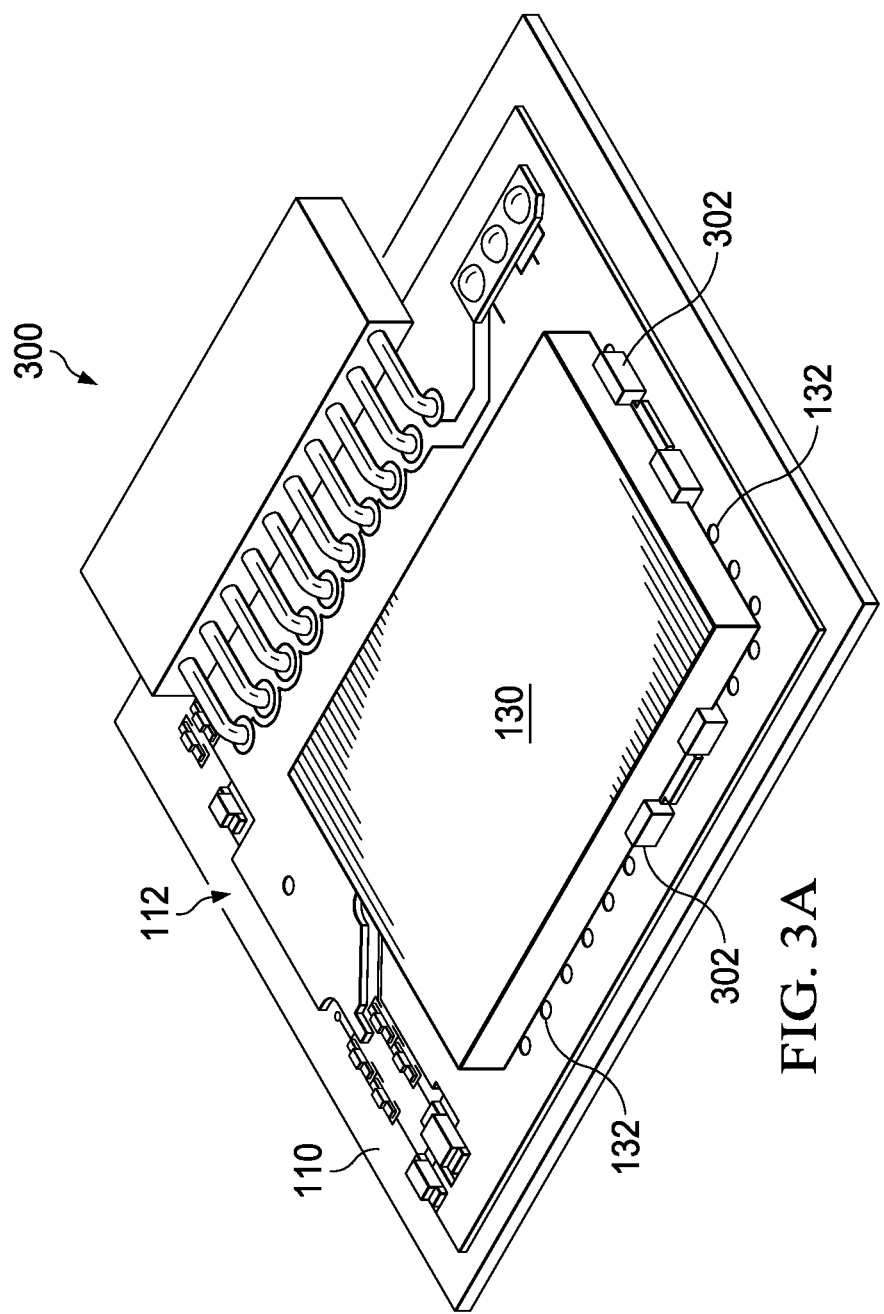
FIG. 3A shows a three-quarters perspective view of an example implementation of a system including a secure enclosure (visible in FIG. 3C) for tamper detection using capacitive sensing.

FIG. 3A shows a three-quarters perspective view 300 of an example implementation of a system 100 as shown in and described with respect to FIG. 1A. FIG. 3A shows the system 100 with the inner top shield 120 (not visible) and the outer top shield 130 covering the secure enclosure 102. Outer brackets 302 (partially visible) hold the outer top shield 130 in place against the PCB 112. The ground vias 132 are visible outside the perimeter of the outer top shield 130.

Figure 3B:
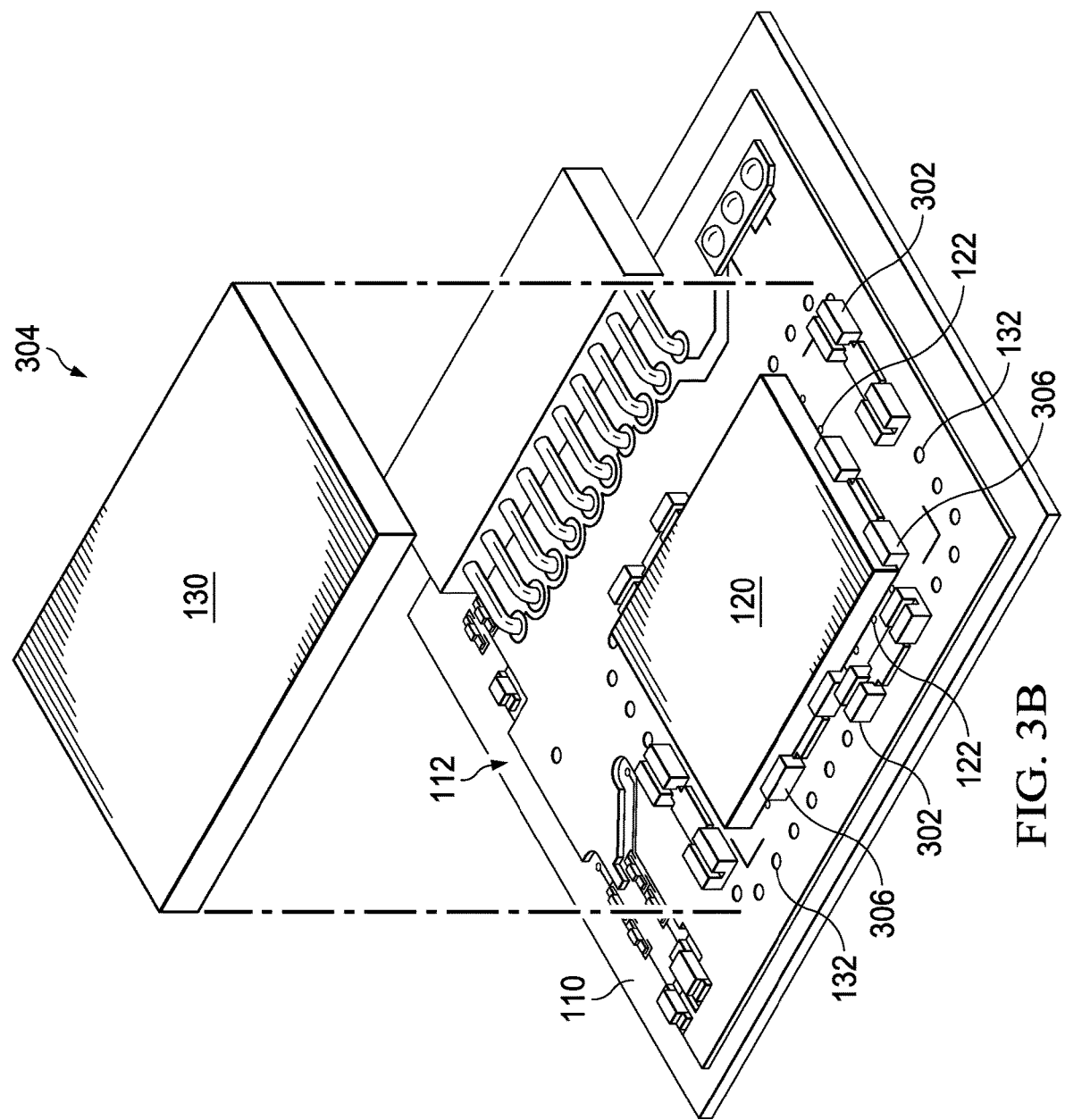
FIG. 3B shows a three-quarters perspective view of the example system implementation of FIG. 3A.

FIG. 3B shows a three-quarters perspective view 304 of the example system 100 implementation of FIG. 3A. In FIG. 3B, the outer top shield 130 is exploded away from the surface of the PCB 112 to reveal the inner top shield 120. Inner brackets 306 hold the inner top shield 120 in place against the PCB 112.

Figure 3C:
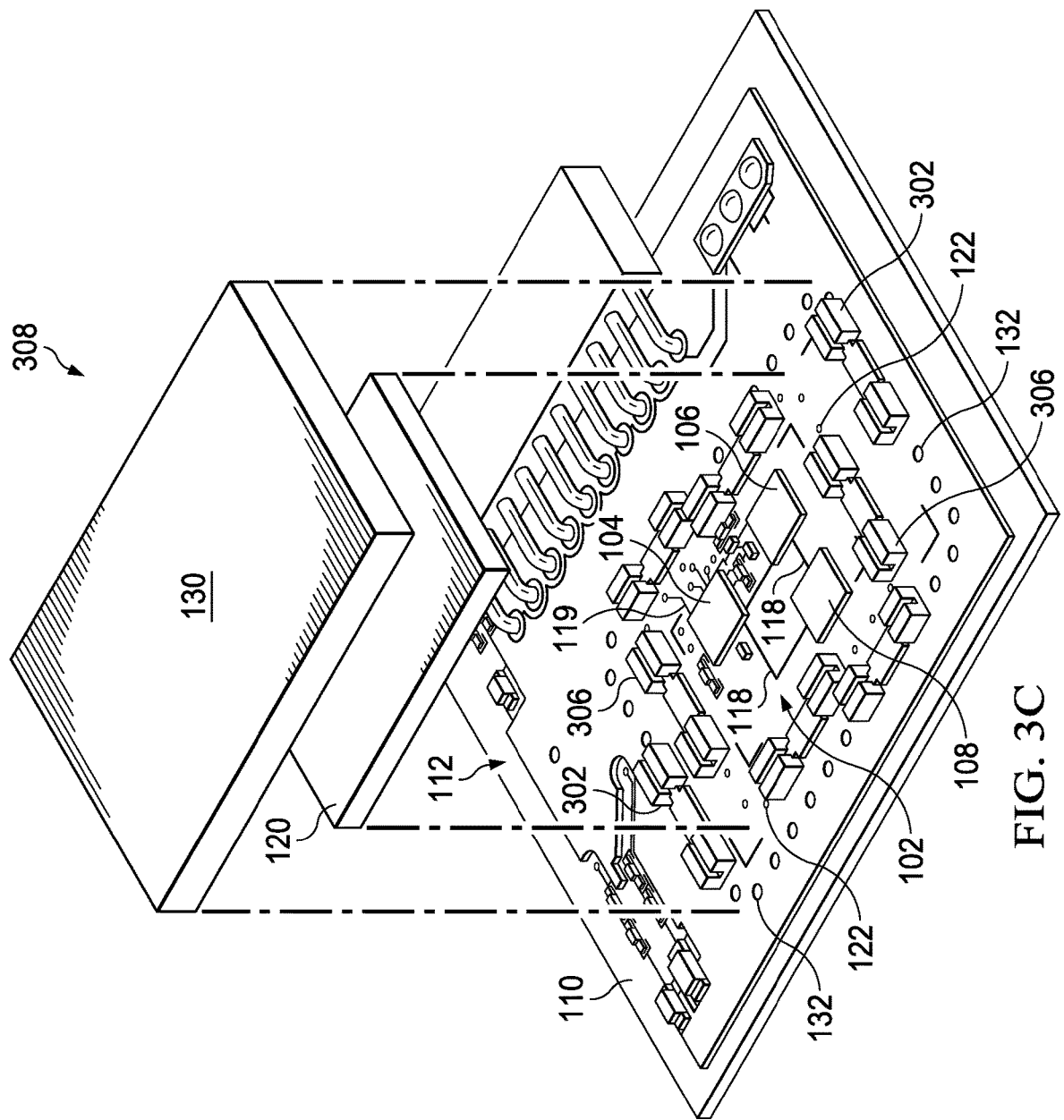
FIG. 3C shows a three-quarters perspective view 308 of the example system implementation of FIG. 3A.

FIG. 3C shows a three-quarters perspective view 308 of the example system 300 implementation of FIG. 3A. In FIG. 3C, the outer top shield 130 and the inner top shield 120 are exploded away from the surface of the PCB 112 to reveal the secure enclosure 102. The capacitive sense vias 122 are visible within the perimeter of the inner top shield 120. (For clarity and simplicity, the inner and outer top shields 120, 130 are spaced relatively far apart in FIGS. 3A, 3B, and 3C. The capacitive sense vias 122 and ground vias 132 are preferably closer together than shown—for example, close enough to deter and/or prevent physical attack by drilling into the secure enclosure 102, as described above.) The control unit 104, the battery 106, and the secure asset 108 are also visible within the space comprising the secure enclosure 102 when the outer and inner top shields 120, 130 are fixedly attached to the PCB 112.

As shown in FIGS. 3A, 3B, and 3C, when the outer and inner top shields 120, 130 are fixedly attached to the PCB 112 by the outer and inner brackets 302, 306, the conductive structural inner volume (120, 122, 126, 128) is capacitively coupled to the conductive structural outer volume (130, 132, 136). Accordingly, changes in the capacitance between the conductive structural inner volume (120, 122, 126, 128) and the conductive structural outer volume (130, 132, 136) (as measured by the capacitive sensor 105 in the control unit 104) indicate tampering—that is, attempts to physically or electrically access the inside of the secure enclosure 102.

Figure 4:
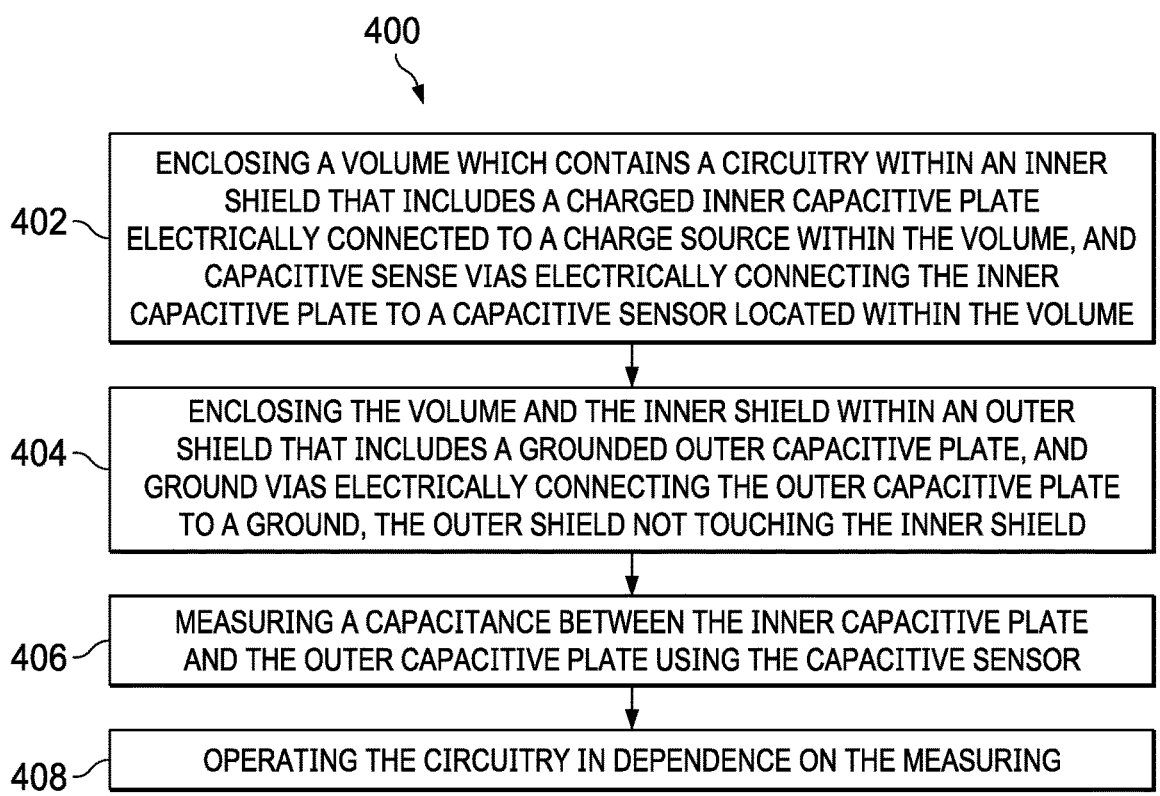
FIG. 4 shows an example of a process for tamper detection using capacitive sensing.

FIG. 4 shows an example of a process 400 for tamper detection using capacitive sensing. In step 402, a volume containing a secure asset (for example, circuitry) is enclosed within an inner shield, the inner shield including a charged inner capacitive plate coupled to a charge source within the volume, and capacitive sense vias coupling the inner capacitive plate to a capacitive sensor 105 located within the volume. In step 404, the volume and the inner shield are enclosed within an outer shield, the outer shield including a grounded outer capacitive plate, and ground vias coupling the outer capacitive plate to a ground, the outer shield not touching the inner shield. In step 406, a capacitance between the inner capacitive plate and the outer capacitive plate is measured using the capacitive sensor 105. In step 408, the circuitry is operated in dependence on the measuring—for example, if a measured change in capacitance is detected, then tampering is thusly presumed as the cause and a portion of the secure asset is caused to become inoperable. Also, a reporting element can be triggered when tampering is detected. For example, an alarm can be activated, information about the detected change in capacitance can be stored in storage within the secure enclosure, or a signal indicating the detected tampering can be sent to the outside of the secure enclosure.

Modifications are possible in the described embodiments, and other embodiments are possible, within the scope of the claims.

In some embodiments, there is more than one electrical connection between the inside and the outside of the secure enclosure.

In some embodiments, there is a direct electrical connection between the exterior of the secure enclosure and the secure asset.

In some embodiments, there is no electrical connection between the inside and the outside of the secure enclosure.

In some embodiments, power requirements of the control unit and secure asset are small. In some embodiments in which the secure enclosure is isolated from power sources outside of the secure enclosure, a small battery, such as a coin cell battery, can be used.

In some embodiments, only one of the inner top and outer shields comprises electromagnetic shielding. In some embodiments, only one of the bottom inner and outer shields comprises electromagnetic shielding.

In some embodiments, I/O between the secure enclosure and the exterior is routed through the control unit. In some embodiments, the control unit is not connected to communicate with the secure asset. In some embodiments, the control unit is not electrically connected to the secure asset.

In some embodiments, an MSP430FR2633 or other MSP430 CapTIvate enabled device comprises or is used in a control unit. These devices are commercially available from Texas Instruments.

In some embodiments, the secure enclosure can contain, for example, one or more of: a processor, a memory, or a communications device.

In some embodiments, more than two via rings are used. In some embodiments, vias are arranged other than in a ring.

In some embodiments, tamper sensors in addition to the control unit are used, such as photon or pressure sensors.

In some embodiments, the battery is selected to be large enough to last for a projected lifetime of the secure asset. In some embodiments, the battery's lifetime defines the useful lifetime of the secure asset. In some embodiments, power is supplied by wires extending from the outside to the inside of the secure enclosure. That is, the charge source for charging the top and bottom inner shields can be powered by a power source 146 outside the secure enclosure, and connected to the control unit by, for example, the connection.

In some embodiments, capacitive sensing and data protection (such as a hardware-level security key) can be implemented on the same device.

In some embodiments, one or more of the outer top shield, the inner top shield, the outer bottom shield, and the inner bottom shield, is detachable. In some embodiments, one or more of the outer top shield, the inner top shield, the outer bottom shield, and the inner bottom shield, is not detachable (for example, is soldered onto the PCB or is connected to the PCB using an adhesive).

In some embodiments, voltage, temperature, and humidity monitoring subsystems can be included in a tamper detection system, insider or outside of the secure enclosure, to assist in detecting physical tamper attacks, and/or to provide measurements which can be analyzed to compensate for environmental factors which can affect capacitance measurements. In some embodiments, these subsystems are located inside the secure enclosure for use in conjunction with the capacitance measurement system. In some embodiments, these subsystems are integrated into the control unit (for example, integrated into an integrated circuit which includes capacitance measurement circuits). In some embodiments, the timing of capacitance measurements, and/or the timing of activating voltage, temperature, and humidity monitoring subsystems subsystems, can be controlled to appear non-deterministic to an attacker, for example, using random or pseudorandom timing for measurement polling events.

In some embodiments, devices within the secure enclosure are powered only by a battery or other energy storage fully contained within the secure enclosure. In some embodiments, devices within the secure enclosure can receive power from outside the secure enclosure.

In some embodiments, the secure asset and/or the control unit is programmable from outside of the secure enclosure. In some embodiments, the secure asset can be reprogrammed by the control unit. In some embodiments, the control unit can be reprogrammed by the secure asset.

In some embodiments, an inner shield and an outer shield fully surround the PCB (or other platform on which the secure asset is mounted). In some such embodiments, there is only one inner shield and only one outer shield. In some such embodiments, the shields alone (without the PCB) are sufficient to surround and enclose the secure enclosure.

In some embodiments, the control unit changes the operation of the secure asset (for example, causing reprogramming or destruction of portions or all of the secure asset) if a change in capacitance between the inner and outer plate capacitors is greater than a threshold. In some embodiments, the threshold is dependent on a state of charging the inner plate capacitor or on environmental factors (such as sensed voltage, temperature, and humidity).

In some embodiments, the charge source for the inner capacitive plate is other than a battery.

In some embodiments, the inner top shield and the outer top shield are shaped as five-sided boxes, as N-sided polyhedra with N−1 closed sides, or as continuous portions of a sphere.

In some embodiments, the electrical connection between the inside and outside of the secure enclosure can be configured to provide into the secure enclosure (from a communications node 148 outside of the secure enclosure to which the electrical connection is connected) one or more of power, control signals for the circuitry and/or the capacitive sensor, or data for use in operation of the circuitry and/or the capacitive sensor.

In some embodiments, ground vias and/or capacitive sense vias are larger or smaller. In some embodiments, more or fewer ground vias and/or capacitive sense vias are used.

In some embodiments, polyhedral shapes made of conductive material, including polyhedral shapes other than rectangular parallelepipeds, which open on one or more faces and configured to fixedly or removeably attach to the PCB without a gap in the shape or between the shape and the PCB, can be used as shields (capacitive plates).

In some embodiments, inner and outer bottom shields are mounted on the bottom surface and enclose an empty volume, similarly to the inner and outer top shields. In some such embodiments, circuitry is located within the empty volume enclosed by the inner and outer bottom shields.

In some embodiments, there are gaps in one or more of the inner top shield, the outer top shield, the inner bottom shield, or the outer top shield, or between one or more of the shields and the PCB (or other platform on which devices in the secure enclosure are mounted), such that the gaps are too small for an attacker to use to gain access to the inside of the secure enclosure.

In some embodiments, the control unit uses different (or randomized) frequencies to charge and discharge the inner shield (the top and bottom inner plate and the capacitive sense vias).

In some embodiments, the outer shield is electrically coupled to a ground, but is not at a voltage of the ground. For example, the outer shield can be electrically coupled to a ground via a resistor and/or one or more other impedance elements. In some embodiments, the outer shield is configured so that there is an electric potential difference between the outer shield and the inner shield (for example, other than a potential difference corresponding to a charged inner shield and a grounded outer shield).

In some embodiments, a conductive structural inner volume does not include capacitive sense vias and/or an inner bottom plate. In some embodiments, a conductive structural outer volume does not include ground vias and/or an outer bottom plate. In some embodiments, different capacitive sensors measure capacitance with respect to inner and outer top plates than with respect to inner and outer bottom plates and/or with respect to ground vias and capacitive sense vias.

In some embodiments, the outer shield(s) can be coated and/or covered with a non-conductive material. In some embodiments, exposed portions of vias can be coated and/or covered with a non-conductive material.

In some embodiments, the secure enclosure is hermetically sealed.

In some embodiments, the secure enclosure and/or the empty volume is wholly or partially filled with a non-conductive material, such as a potting material (encapsulation material).

In some embodiments, a key can be transmitted into the control unit from outside the secure enclosure which disables at least part of the control unit functionality; for example, to allow for intended access to the interior of the secure enclosure.

In some embodiments, capacitive sense vias can be located outside the perimeter of the inner top and/or bottom shields and within the perimeter of the outer top and/or bottom shields. In some embodiments, capacitive sense vias can be located to overlap the perimeter of the inner inner top and/or bottom shields. In some embodiments, ground vias can be located inside the perimeter of the outer top and/or bottom shields and within the perimeter of the inner top and/or bottom shields.

In some embodiments, no return line is used. In some embodiments, the battery and the control unit are coupled to the ground via the capacitive coupling between the inner and outer shields.

In some embodiments, the inner top plate is driven (charged) separately from the inner bottom plate and/or the capacitive sense vias. That is, the inner top plate, the inner bottom plate, and the capacitive sense vias can be driven using separate channels from the capacitive sensor (or otherwise directly or indirectly from the battery or other charge source). Power can also be distributed on the same or additional separate channel(s) to other devices within the secure enclosure.

In some embodiments, the connection uses a medium other than electricity through a wire to transmit signals, e.g., photonic or galvanic signal transmission.

In some embodiments, the capacitive sense vias are capacitively coupled to the ground vias.

What is claimed is:

1. An enclosure for circuitry, comprising:
   a platform to which the circuitry is fixedly coupled;
   a charge source;
   a first capacitive plate fixedly coupled to the platform, and either alone, or together with the platform, surrounding a volume containing the circuitry and the charge source, the charge source electrically coupled to and configured to charge the first capacitive plate;
   a second capacitive plate fixedly coupled to the platform without touching the first capacitive plate, and either alone, or together with the platform, surrounding the first capacitive plate, the second capacitive plate configured so that there is an electric potential difference between the first capacitive plate and the second capacitive plate; and
   a capacitive sensor electrically connected to the first capacitive plate and configured to determine when a capacitance between the first and second capacitive plates is changed.

2. The enclosure of claim 1, wherein the second capacitive plate is electrically coupled to a ground.

3. The enclosure of claim 1,
   wherein the first capacitive plate includes a first top portion;
   wherein the charge source, the circuitry, and the first top portion are fixedly coupled to a surface of the platform;
   wherein the second capacitive plate includes a second top portion, the first top portion being nested within the second top portion;
   wherein the first capacitive plate includes a first bottom portion fixedly coupled to a portion of the platform which is displaced in a direction orthogonal to, and towards an interior of the platform from, the surface; and
   wherein the second capacitive plate includes a second bottom portion fixedly coupled to a portion of the platform which is displaced, more than the first bottom portion, in a direction orthogonal to, and towards an interior of the platform from, the surface;
   further comprising multiple capacitive sense vias coupling the first top portion to the first bottom portion, and multiple ground vias coupling the second top portion to the second bottom portion.

4. The enclosure of claim 3, wherein the ground vias are arranged in a ring, to form a ring of ground vias, around a perimeter of the volume.

5. The enclosure of claim 4, wherein the capacitive sense vias are arranged in a ring concentrically within the ring of ground vias, and wherein the capacitive sense vias are close to and in alternating position with the ground vias.

6. The enclosure of claim 3, wherein the ground vias and/or the capacitive sense vias are arranged around a perimeter of the volume such that drilling into the volume without contacting at least one of the first capacitive plate, the second capacitive plate, the ground vias, and the capacitive sense vias, is prevented.

7. The enclosure of claim 1, further comprising:
a communications node not surrounded by the first capacitive plate or the second capacitive plate, the communications node configured to receive an electronic signal; and
a communications line electronically coupling the capacitive sensor and/or the circuitry to the communications node.

8. The enclosure of claim 7, wherein the electronic signal can include one or more of power, control signals for the circuitry and/or the capacitive sensor, data for use in operation of the circuitry and/or the capacitive sensor, or programming for the capacitive sensor.

9. The enclosure of claim 1, wherein the first capacitive plate either alone, or together with the platform, surrounds the volume without gaps, and wherein the second capacitive plate either alone, or together with the platform, surrounds the first capacitive plate without gaps.

10. The enclosure of claim 1, wherein at least one of the first capacitive plate and the second capacitive plate is configured to shield the volume against electric and/or magnetic fields.

11. The enclosure of claim 1, wherein the first and second capacitive plates are shaped as five-sided boxes, as N-sided boxes with N−1 closed sides, or as portions of a sphere.

12. The enclosure of claim 1, wherein the capacitive sensor is configured to cause a specified portion of the circuitry to become inoperable if the capacitive sensor detects the capacitance between the first and second capacitive plates is changed, more than by a threshold amount of change, and other than by the charge source.

13. The enclosure of claim 1, wherein the circuitry and the capacitive sensor are configured not to receive power from outside of the volume.

14. The enclosure of claim 1, wherein the charge source is configured to be powered via an electrical coupling between the charge source and a power node outside the volume, the power node configured to receive power.

15. A method of protecting circuitry from tampering, the method comprising:
enclosing, within an inner shield, a volume which contains the circuitry, the inner shield including a charged inner capacitive plate coupled to a charge source within the volume, and capacitive sense vias coupling the inner capacitive plate to a capacitance sensor;
enclosing, within an outer shield, the volume and the inner shield, the outer shield including a grounded outer capacitive plate, and ground vias coupling the outer capacitive plate to a ground, the outer shield not touching the inner shield;
measuring a capacitance between the inner capacitive plate and the outer capacitive plate using a sensor located within the volume; and
operating the circuitry in dependence on the measuring.

16. The method of claim 15, wherein the operating includes causing a specified portion of the circuitry to become inoperable if the capacitive sensor detects the capacitance between the first and second capacitive plates is changed other than by the charge source.

17. The method of claim 16, wherein the causing a specified portion of the circuitry to become inoperable includes one or more of deleting specified data, making specified data unchangeable, or inducing a physically self-destructive event.

18. The method of claim 16, wherein the capacitance being changed other than by the charge source is determined in dependence on a comparison between the capacitance and a threshold.

19. The method of claim 15, wherein a polling frequency of a capacitance between the inner shield and the outer shield is random and/or pseudorandom.

20. The method of claim 15, further comprising shielding the volume against electric and/or magnetic fields using the inner shield and the outer shield.

21. The method of claim 15, further comprising measuring one or more of voltage, temperature, and humidity, and compensating in the measuring step for a measured voltage, temperature, and/or humidity.

22. The method of claim 15, wherein the charge source is powered by a power source outside the volume.

23. A method of protecting circuitry from tampering, the method comprising:
enclosing, using an inner shield, a volume which contains the circuitry, the inner shield including a charged inner capacitive plate coupled to a charge source within the volume, and capacitive sense vias coupling the inner capacitive plate to a capacitance sensor;
enclosing, using an outer shield, a volume and the inner shield, the outer shield including a grounded outer capacitive plate, and ground vias coupling the outer capacitive plate to a ground, the outer shield not touching the inner shield;
measuring a capacitance between the inner capacitive plate and the outer capacitive plate using a sensor located within the volume; and
operating the circuitry in dependence on the measuring.

* * * * *